United States Patent [19]

Kiraly

[11] Patent Number: 5,467,242
[45] Date of Patent: Nov. 14, 1995

[54] METHOD AND APPARATUS FOR SHORT CIRCUIT PROTECTION OF POWER TRANSISTOR DEVICE

[75] Inventor: Laszlo Kiraly, El Segundo, Calif.

[73] Assignee: International Rectifier Corporation, El Segundo, Calif.

[21] Appl. No.: 303,137

[22] Filed: Sep. 8, 1994

Related U.S. Application Data

[63] Continuation of Ser. No. 900,834, Jun. 18, 1992, abandoned.

[51] Int. Cl.[6] .................. H02H 9/02; H02H 3/00
[52] U.S. Cl. .................. 361/94; 361/58; 361/86; 361/101; 361/18
[58] Field of Search .................. 361/18, 23, 28, 361/42, 58, 86, 93, 94, 98, 100, 101; 323/276–279; 307/570, 575; 327/432, 387

[56] References Cited

U.S. PATENT DOCUMENTS

| | | | |
|---|---|---|---|
| 3,743,855 | 7/1973 | Struger | 307/570 |
| 4,525,765 | 6/1985 | Brajder | 361/88 |
| 4,551,779 | 11/1985 | Morakami et al. | 361/86 |
| 4,893,212 | 1/1990 | Wong et al. | 361/96 |
| 5,200,879 | 4/1993 | Sasagawa et al. | 361/93 |

FOREIGN PATENT DOCUMENTS

| | | |
|---|---|---|
| 0107137 | 5/1984 | European Pat. Off. . |
| 0206505 | 12/1986 | European Pat. Off. . |
| 2123622 | 2/1984 | United Kingdom . |
| 2161337 | 1/1986 | United Kingdom . |
| 2183955 | 1/1986 | United Kingdom . |

Primary Examiner—Jeffrey A. Gaffin
Assistant Examiner—Ronald W. Leija
Attorney, Agent, or Firm—Ostrolenk, Faber, Gerb & Soffen

[57] ABSTRACT

A circuit and method for detecting and protecting against an overcurrent condition in a power transistor switching device, and particularly an IGBT. The power transistor switching device has main terminals and a control terminal, the main terminal having a normal saturation voltage therebetween during normal conduction of the power transistor device. The circuit includes a driver providing control signals to the control terminal of the power transistor device for switching the power transistor device on and off, a sensing circuit coupled to the power transistor device for sensing the saturation voltage of the power transistor device, and a switching circuit coupled to the control terminal of the power transistor device and responsive to the sensing circuit for removing the control signals from the control terminal in the event the saturation voltage reaches an abnormal level indicating an overcurrent condition in the power transistor device.

29 Claims, 5 Drawing Sheets

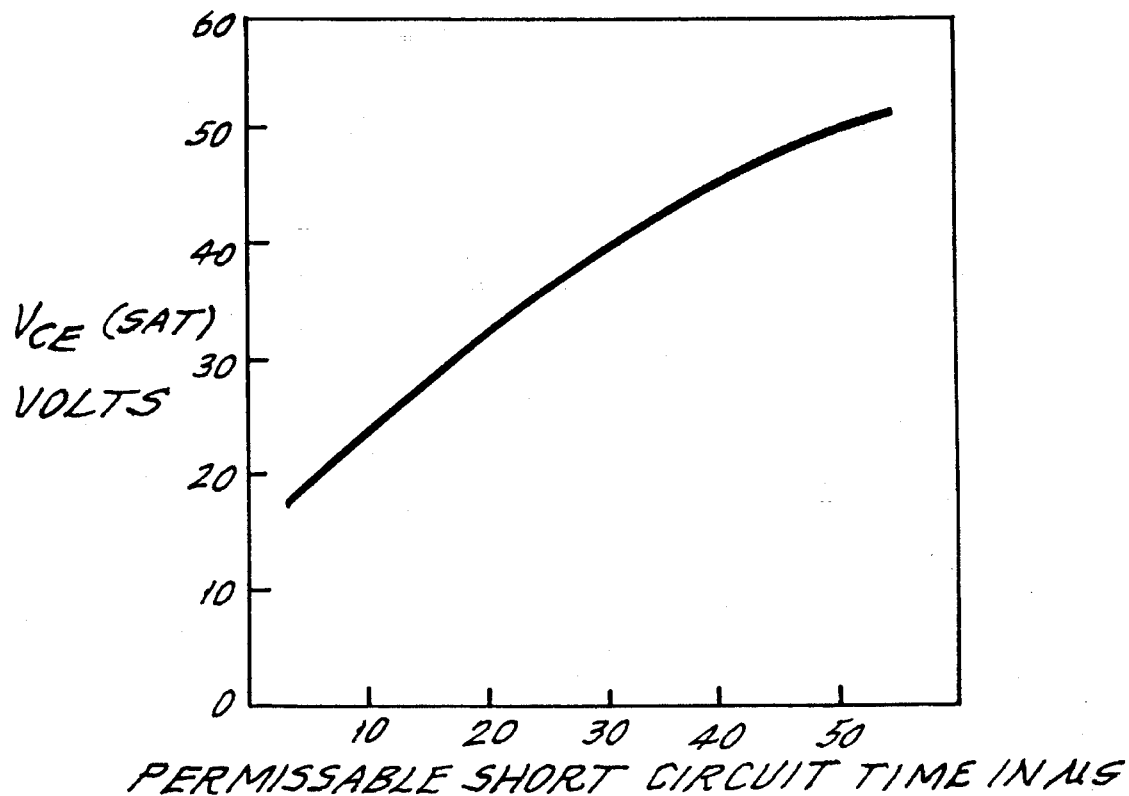
FIG. 1 TYPICAL IGBT SHORT CIRCUIT CHARACTERS
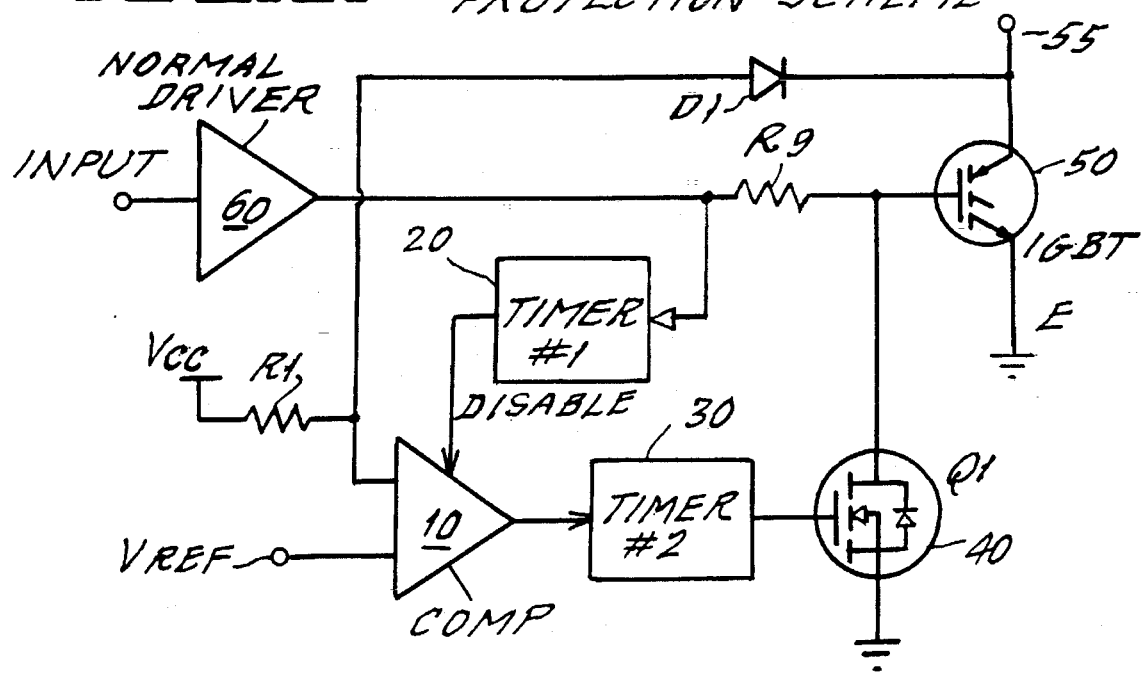
FIG. 2 SHORT CIRCUIT PROTECTION SCHEME

1

METHOD AND APPARATUS FOR SHORT CIRCUIT PROTECTION OF POWER TRANSISTOR DEVICE

This is a continuation of application Ser. No. 07/900,834 filed on Jun. 18, 1992, now abandoned.

BACKGROUND OF THE INVENTION

The present invention relates to power transistor devices, and particularly to short circuit and overcurrent protection circuits and methods for power transistor devices and in particular MOS gated power transistors. Even more particularly, the present invention relates to a method and apparatus for protecting insulated gate bipolar transistors under short circuit and overcurrent conditions.

A critical consideration in applying IGBTs to pulse width modulated (PWM) inverter AC motor drives is to protect them under short circuit conditions that can occur from line to line or line to ground.

IGBTs are available that have short circuit times approaching those of bipolar transistors. These types can be protected by the same relatively slow acting circuitry used for bipolar transistors.

The most efficient IGBTs, however, offer significant advantages in terms of lower losses, smaller packages, smaller heat sinks and compactness, but have lower short circuit times, i.e., they can tolerate short circuit conditions for a shorter period of time than bipolar transistors.

Traditional protection methods for bipolar transistors are inapplicable to these high efficiency IGBTs, because they do not provide the necessary speed in detecting a short circuit or over current condition. By the time that these traditional circuits respond, the IGBT may have been destroyed by the overcurrent.

IGBTs are becoming devices of choice in applications such as variable speed motor controllers, uninterrupted power supplies and high frequency welders. They generally offer comparable or lower power dissipation, higher operating frequency and simplification of drive circuitry. Thus, systems using IGBTs offer greater compactness, greater efficiency and superior dynamic performance.

The properties of the IGBT that make these advantages possible bring with them a new design consideration. An IGBT that is designed to achieve maximum efficiency has a relatively high gain and thus a short circuit current that is significantly higher than that obtained with a bipolar transistor. The power density in the IGBT with an applied short circuit can therefore be much higher than in the bipolar transistor.

An IGBT that is designed to minimize power dissipation under normal load conditions, therefore, may not be able to handle an unabated short circuit for as long as a bipolar transistor. It is not as fault tolerant, and therefore requires a more "alert" or fast acting protective circuit. The circuit of the invention provides a means which is particularly useful in protecting IGBTs against such short circuits.

SUMMARY OF THE INVENTION

It is an object of the present invention to provide a protection method and apparatus for power transistors and in particular for IGBTs.

It is a further object of the present invention to provide such a short circuit current protection circuit for power transistors which operates more quickly than circuits known heretofore and which is therefore applicable to the protection of IGBTs.

It is yet still a further object of the present invention to provide such a short circuit current protection circuit for power transistors, including IGBTs, which is particularly applicable to power application control circuitry, for example, pulse width modulators for motor drives.

It is yet still a further object of the invention to provide a short circuit overcurrent protection circuit for power IGBT devices which responds to shut down the IGBT prior to any damage thereto by a sensed overcurrent.

It is yet still a further object of the invention to provide an overcurrent protection circuit for power transistors, and particularly IGBTs, which will reliably protect the power transistor devices in the event of actual high current faults, but will be able to prevent nuisance trips in the event of spikes, transient conditions and other events which cause momentary current spikes for time periods less than would cause damage to the power transistors.

The above and other objects of the present invention are achieved by a circuit for detecting and protecting against an overcurrent condition in a power transistor switching device, the power transistor switching device having main terminals and a control terminal, the main terminals having a range of normal saturation voltage therebetween during normal conduction, the circuit comprising driver means providing control signals to the control terminal of the power transistor device for switching the power transistor device on and off, means coupled to the power transistor device for sensing the saturation voltage of the power transistor device, and means responsive to the sensing means and coupled to the control terminal of the power transistor device for removing the control signals from the control terminal in the event the saturation voltage reaches an abnormal level indicating an overcurrent condition in the power transistor device.

Preferably, the sensing means comprises comparator means having a first input coupled to the power transistor device for sensing the saturation voltage and having a reference voltage input such that if the first input exceeds the reference voltage input due to an increased saturation voltage, the comparator means generates a signal to the removing means for removing the control signals from the control terminal.

According to a preferred embodiment, the sensing means further comprises a diode having one terminal coupled to said power transistor device at the potential of said saturation voltage, and having another terminal coupled to resistor means, the resistor means being coupled to said first input of said comparator means and having a terminal coupled to a voltage reference level.

The above and other objects of the present invention are also achieved by a method for detecting and protecting against an overcurrent condition in a power transistor switching device, the power transistor switching device having main terminals and a control terminal, the main terminals having a range of normal saturation voltage therebetween during normal conduction, the method comprising providing control signals to the control terminal of the power transistor device for switching the power transistor device on and off, sensing the saturation voltage of the power transistor device, and removing the control signals from the control terminal in the event the saturation voltage reaches an abnormal level indicating an overcurrent condition in the power transistor device.

Preferably, the step of sensing comprises comparing the saturation voltage or a voltage related to the saturation voltage to a reference voltage and generating a signal to remove said control signals from said control terminal if said saturation voltage or related voltage exceeds said reference voltage.

Other objects, features and advantages of the present invention will become apparent from the following detailed description of the invention.

BRIEF DESCRIPTION OF THE DRAWINGS

The invention will be described in greater detail in the following detailed description with reference to the drawings in which:

FIG. 1 shows a typical graph for an IGBT relating collector to emitter saturation voltage to permissible short circuit time in microseconds;

FIG. 2 shows a block/schematic diagram of a protection circuit according to the present invention;

DETAILED DESCRIPTION OF THE DRAWINGS

Figure 3:
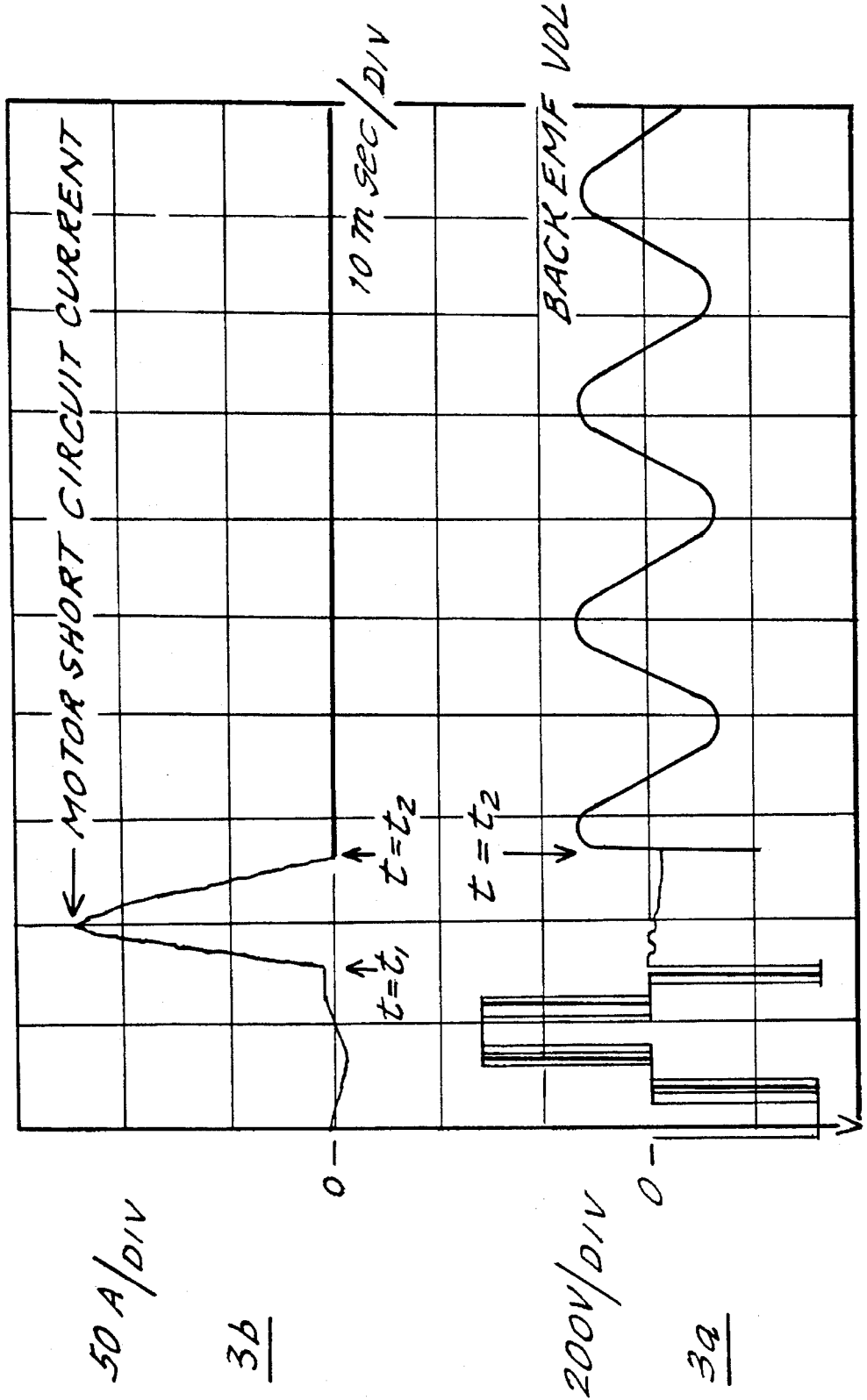
FIG. 3 shows the response of the protection circuit shown in FIG. 2, including FIG. 3a showing the gate voltage at the power transistor device, before, during, and after a short circuit condition, and FIG. 3b showing motor current when a short circuit occurs.

IGBTs with the most rugged intrinsic short circuit performance generally have high saturation voltages and high operating losses.

Conversely, IGBTs with the lowest saturation voltages and low operating losses have very low tolerance to high short circuit conditions.

With reference now to the drawings, FIG. 1 shows typical IGBT saturation voltage as a function of permissible short circuit time. The data for this graph assumes that sufficient voltage is applied to the gate to keep the normal saturation voltage close to a practical minimum and the same gate drive voltage is maintained during the fault. FIG. 1 indicates that an IGBT with a saturation voltage less than two volts (high efficiency IGBT) typically has a permissible short circuit time of five microseconds or less. A less efficient IGBT with a saturation voltage of four volts to five volts can have a short circuit time in the range of 30 microseconds. This short circuit time is of the same order as for a typical bipolar transistor, but the saturation voltage is now higher than that for a bipolar transistor.

Ground faults or terminal to terminal short circuits result in severe and sudden overload currents. The conventional pulse width modulator loop used in typical motor controllers is unable to guard against such a fault, since the fault current bypasses motor or filter inductances and rises very rapidly in the power transistors. In the first instant of time, the protection circuit must rely upon the intrinsic short circuit capability of the transistors, followed by rapid sensing of the fault and removal of the gate drive, if the fault current persists beyond the permitted short circuit period.

If the fault is a transient that clears itself before the permitted short circuit period has expired, then the transistor should remain in conduction. Turning off the transistor would only constitute a nuisance trip. Diode reverse recovery current is an example of the type of transient overcurrent which should be ignored. Referring again to FIG. 1, the circuit according to the invention, and to be discussed with reference to FIG. 2, provides a reliable protection circuit for an IGBT with the lowest saturation voltage and hence shortest permissible short circuit time. The circuit according to the invention provides reliable protection against real faults, yet is insensitive to spikes, transients and other false alarms.

FIG. 2 shows a functional schematic of a protection circuit according to the invention. The protection circuit according to the invention comprises a comparator 10, diode D1, a resistor R1, which may comprise a portion of a voltage divider, and preferably timers 20 and 30, the purpose of which will be explained. A turn-off device 40 is also provided to remove gate current from the power transistor device. The power transistor device is shown as an IGBT 50. A buffer or driver 60 provides gate pulses to the IGBT 50 through a conventional gate resistance Rg. The IGBT 50 is coupled between ground and a point 55 connected to a load, which may comprise a suitable load device or another circuit similar to the circuit shown in FIG. 2 for driving a high side IGBT, as will be known to those of skill in the art. Comparator 10 is provided with a reference voltage Vref.

Timer 20 is preferably adjusted to allow for IGBT turn-on delay and the effect of overcurrent caused by diode recovery time. This timer thus prevents false triggering of the protection circuit during the initial turn-on period, when the collector to emitter voltage of the IGBT may still be high.

During normal conduction, the saturation voltage of the IGBT is less than Vref, and therefore, diode D1 is forward biased through resistor R1 coupled to a positive voltage such as VCC, and the output of the comparator therefore remains low. When an overcurrent occurs, for example, due to short circuit in the load, the collector-emitter voltage of the IGBT increases above Vref causing the input to comparator 10 to go high, the diode D1 to become back biased and thus causing the output of the comparator to go high, initiating timer 30. If the fault disappears before the end of the timer 30 period, which is set to allow the permissible short circuit time, the output of the comparator goes low before timer 30 is reset and normal operation proceeds. If the fault is still present at the end of the timeout period of timer 30, the timer output goes high, and transistor 40, shown as a MOSFET, switches on and the gate voltage to the IGBT 50 is removed, turning it off. Alternatively, the output of timer 30 can be supplied to a disable input of the driver 60, thereby removing gate voltage from the IGBT 50.

The waveforms of FIG. 3 illustrate performance of the above-described protection circuit. FIG. 3a shows line to line voltage and FIG. 3b shows phase current at the output of an inverter driving an AC motor. The first part of FIG. 3a shows the conventional pulse width modulated voltage waveform, and the first part of FIG. 3b shows the conventional sinusoidal motor current. Under the no load condition shown initially in FIG. 3, the current is five amperes RMS and the voltage switches occur at 325 volts. At instant T1, the output terminals of the inverter were shorted out, activating the protection circuit, forcing shutdown. As seen from FIG. 3, the short circuit lasted for about 12 milliseconds, during which time the motor back EMF caused a large current through the short 125 ampere peak. Upon removal of the short circuit, current ceased to flow while the back EMF voltage appears at the motor terminal, as shown by the sinusoidal voltage identified as the back EMF voltage in FIG. 3a.

Figure 4:
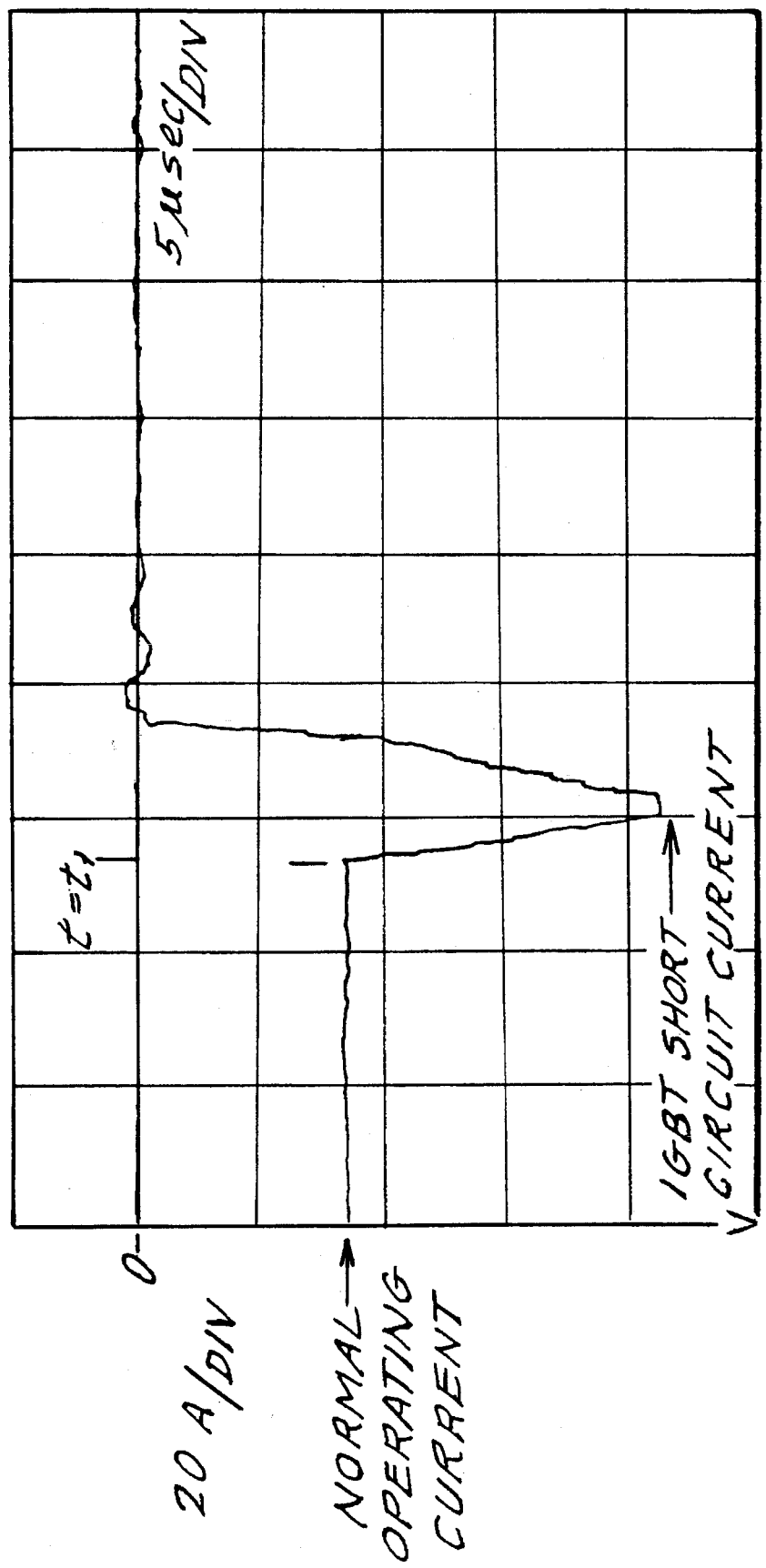
FIG. 4 shows the current through the IGBT power device before, during, and after a short circuit condition, and the response time of the circuit according to the invention.

FIG. 4 shows the actual short circuit current through the IGBT. In this case, the output terminals of the inverter were shorted while the motor was in the locked rotor mode. The expanded scale shown in FIG. 4 shows that the IGBT current jumped up from the normal operating current of 32 amperes at that instant to 85 amperes. The protection circuit removed the gate drive voltage after approximately five microseconds, turning the device off and shutting down the drive.

Figure 5:
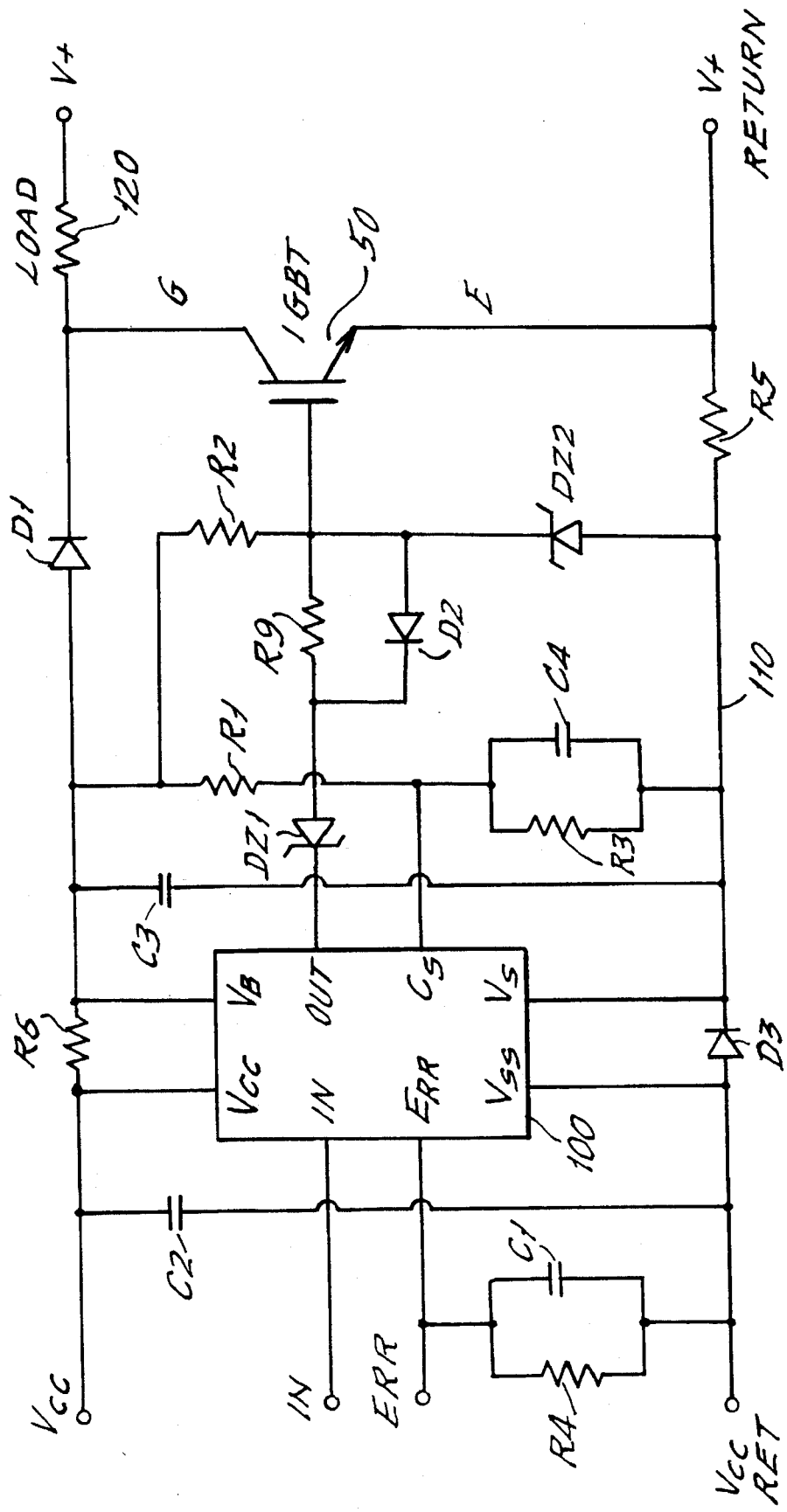
FIG. 5 shows a circuit diagram for a portion of a motor control circuit using the protection circuit according to the invention and driving an IGBT.

FIG. 5 shows in detail a portion of a motor drive circuit utilizing the principles of the present invention. The circuit shown in FIG. 5 is one-half of a bridge circuit for one phase of a three-phase motor drive. Six of such circuits would be employed, connected in three series pairs, in order to drive a three-phase motor.

Figure 6:
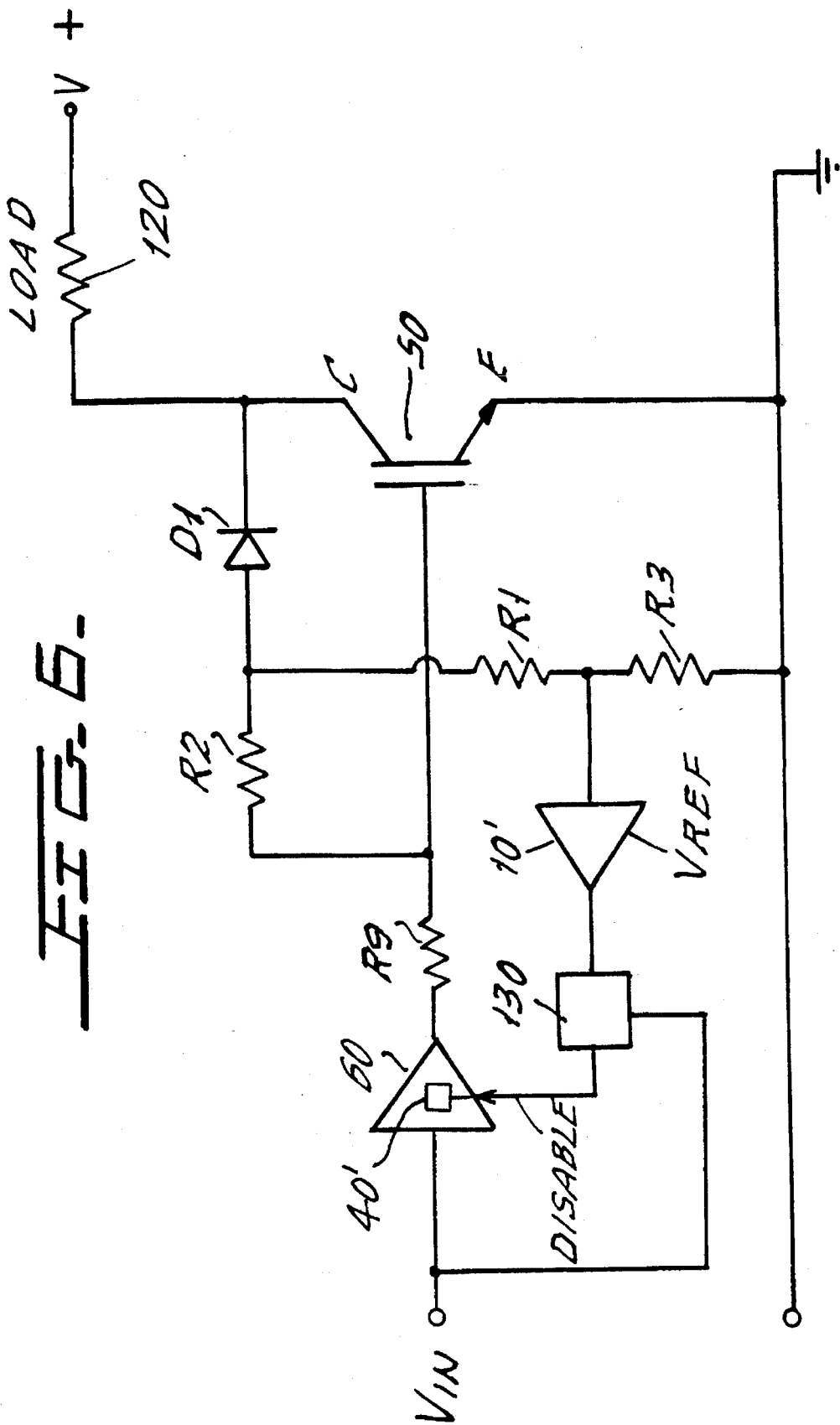
FIG. 6 shows a simplified diagram of the circuit shown in FIG. 5 to aid in explanation.

Reference is now made to FIG. 5, and also FIG. 6, which shows a simplified version of the schematic shown in FIG. 5, including portions of component 100 shown in FIG. 5.

Turning now to FIG. 5, an IR 2125 current limiting MOS gate driver, available from International Rectifier Corp., the assignee of the present application, is employed to drive an IGBT 50. The gate driver 100 includes an input terminal IN, an error terminal ERR, conventional fixed and floating supplies VCC and VB, output terminal OUT, ground return VS, power supply voltage return VSS and a current sensing terminal CS. The functions of each of these terminals are known in the art, but the terminal of primary importance is the current sensing terminal CS. In the normal use of the IR 2125 device 100, the terminal CS is connected through a sensing resistor to terminal VS. The sensing resistor typically is connected into the output circuit of the power transistor device being gated. In the case of high efficiency IGBTs, the use of the sensing resistor coupled into the output circuit will not offer a fast enough response, and the currents through the sensing resistor will be too high.

According to the invention, instead of using a sensing resistor essentially in series with the power transistor device, the collector emitter saturation voltage of the IGBT 50 is sensed instead.

Returning again to gate driver 100, the error terminal ERR is provided for logical shutdown of the device 100 in the case of an error condition. A resistor R4 and capacitor C1 are disposed as shown to provide a time delay in the event of such an error originating from a logic portion of another section of the control circuit, not shown.

The collector of IGBT 50 is connected to the cathode of a diode D1 as also shown in FIG. 2. The anode of the diode D1 is coupled to resistors R1 and R2. Resistors R1 and R3 provide a voltage divider, with the divider point being coupled to the CS terminal of the device 100. Resistor R2 is coupled to the gate resistance Rg and the gate of IGBT 50. FIG. 6 shows the circuit of FIG. 5 in simplified form, so all components are not shown there. The cathode of the zener diode DZ1 is connected to the OUT terminal of device 100. A second diode D2 may be provided across resistor Rg, and a second zener diode DZ2 provided between the gate drive and a return bus 110. The return bus 110 is connected through a diode D3 to the low voltage VCC return and through an isolating resistor R5 to the high voltage V+return. The collector of IGBT 50 is connected to a load 120, which may comprise a load device or another power transistor device operating as the high side device, in which case the common point between IGBT 50 and the high side device is connected to one phase of the controlled load device, for example, an AC motor.

A resistor R6 isolating the fixed and floating voltage supplies and decoupling capacitors C2 and C3 are provided as well known in the art. A further capacitor C4, which provides a time delay, is provided across resistor R3. The purpose of this time delay circuit will be discussed in further detail below.

During normal operation, pulses are received by device 100 at terminal IN and higher current output pulses are supplied at the terminal OUT through zener diode DZ1 and gate resistance RG to the IGBT. The zener diode DZ1 will be in avalanche mode during normal operation. During normal operation, the collector emitter saturation voltage is low, and diode D1 is forward biased, bringing the common point between resistors R1 and R3 to a level approaching the potential of bus 110, i.e., approximately ground, and thereby maintaining device 100 in its normal state. Device 100, as shown in FIG. 6 and known in the art, includes an internal comparator 10' coupled to a reference voltage.

In the event of a transient condition, the device 100 includes a 500 nanosecond built-in blanking time which prevents turning the IGBT 50 off prematurely, so high transient currents which are below the 500 nanosecond blanking time will not result in nuisance trips. The blanking circuit is indicated by reference numeral 130 in FIG. 6. The circuit 130 has also been indicated schematically to have a logic control input 132 provided to remove the disable input to the driver stage 60 when the input VIN is zero so that the IGBT device 50 can turn on when an input is provided at VIN.

Device 130 thus may serve the function provided by timer 30 in FIG. 2, as well as the start-up function of timer 20.

Capacitor C4 in FIG. 5 also serves to delay the voltage rise to CS if a transient occurs, and thus also suppresses false turn-off of the IGBT 50.

Should a short circuit occur, the saturation voltage VCE increases, diode D1 becomes reverse biased, and the voltage at the comparator input accordingly increases above the threshold voltage. The CS terminal of device 100 rises toward the gate voltage through resistor R2. When the CS terminal goes above its threshold, the output of device 100 turns off and internally approaches ground, and diode DZ1 becomes forward biased and pulls the IGBT gate voltage down. Thus, the transistor device 40 shown in FIG. 2 has also been implemented in the device 100 in the circuit of FIGS. 5 and 6. This switching device is indicated schematically as part of driver 60 in FIG. 6 and identified with reference numeral 40'. A built-in feature of device 100 allows the output terminal OUT to be pulled to half of its value for a time period determined by capacitor C1 and a one microsecond built-in delay and then to zero.

Diode D2 has been provided across the gate resistor Rg to speed up the turn-off, allowing the voltage developed at the gate of IGBT 50 rapidly to be discharged through the device 100. Zener diode DZ2 is provided for gate protection of IGBT 50, preventing the gate voltage from rising above the avalanche voltage of the zener diode DZ2.

An important feature of the circuit of the present invention shown in FIG. 5 is that the short circuit protection of transistor 50 is adaptive. For example, should IGBT 50 have a delayed turn on, the collector-emitter voltage will remain high until the device is fully turned-on. This would appear like a short circuit condition in the load. Since it is not caused by a short circuit, but merely by a delayed turn-on, the protection circuit should not be, and, in fact, is not triggered, according to the invention. This is because the IGBT 50 gate voltage is sensed at the gate, and not at the common point between resistor Rg and diode DZ1. Thus, if the gate voltage is delayed during turn on of the IGBT, the protection circuit is also triggered only after the amount of the delay, thus preventing false protective triggering.

Another feature of the invention shown in FIG. 5 is that it eliminates the need for logic circuitry to the timer (130 in FIG. 6 or 20 in FIG. 2) because the protection adapts itself automatically to the turn-on delay.

There has thus been described a circuit for providing rapid turn-off of a power transistor device in the event of a short circuit or overcurrent condition. The detection of the saturation voltage of the power transistor device allows the circuit to have an extremely rapid response to short circuit and overcurrent conditions, making it particularly applicable to high efficiency power IGBT devices which require rapid turn-off in the event of short circuit conditions to prevent damage to the devices.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A circuit for detecting and protecting against an overcurrent condition in a power transistor switching device, the power transistor switching device having main terminals and a control terminal, the main terminals having a range of normal saturation voltage therebetween during normal conduction of the power transistor device, the circuit comprising:

driver means providing control signals to the control terminal of the power transistor device for switching said power transistor device on and off;

sensing means coupled to the power transistor device for sensing the saturation voltage of the power transistor device, said sensing means including coupling means for providing as an output substantially said saturation voltage when the saturation voltage is in the range of normal saturation voltage and providing substantially a fixed further reference voltage level as the output when the saturation voltage is beyond said range of normal saturation voltage and further comprising means receiving said output for comparing substantially said saturation voltage to a reference voltage level when said saturation voltage is in the range of normal saturation voltage and for comparing substantially the fixed further reference voltage level to said reference voltage level when said saturation voltage is beyond said range of normal saturation voltage;

means responsive to the sensing means and coupled to the control terminal of the power transistor device for removing said control signals from said control terminal in the event said saturation voltage reaches a level beyond said range of normal saturation voltage indicating an overcurrent condition in said power transistor device; and further comprising time delay means coupled between an output of said comparing means and said removing means for preventing removing of said control signals in the event of a transient overcurrent condition at said power transistor device for less than a time period that would damage said power transistor device.

2. The circuit of claim 1, wherein said means for comparing comprises:

comparator means having a first input coupled to said power transistor device provided with substantially the saturation voltage when the saturation voltage is in the range of normal saturation voltage and provided with substantially the fixed further reference voltage level when the saturation voltage is beyond said normal range, and having a reference voltage input coupled to said reference voltage level such that if said first input exceeds said reference voltage input due to an increased saturation voltage, said comparator means generates a removal signal to said removing means for removing said control signals from said control terminal.

3. The circuit of claim 2, wherein said coupling means comprises a diode having a first terminal coupled to said power transistor device at the potential of said saturation voltage, and having a second terminal coupled to resistor means, the resistor means being coupled to said first input of said comparator means and having a terminal coupled to said fixed further reference voltage level.

4. The circuit of claim 3, wherein said resistor means comprises a voltage divider, the voltage divider being coupled between said second terminal of said diode and said fixed further reference voltage level and having a divider point coupled to said first input of said comparator means.

5. The circuit of claim 4, further comprising capacitor means coupled to said voltage divider for providing a delay time in the event of transient conditions at said power transistor device.

6. The circuit of claim 2, further comprising time delay means for disabling said comparator means during a start-up condition such that said power transistor device can be initially switched on during said start-up condition.

7. The circuit of claim 6, wherein said time delay means for disabling said comparator means during a start-up condition is provided between said control terminal of said power transistor device and a disable input of said comparator means.

8. The circuit of claim 6, wherein said time delay means for disabling said comparator means during a start-up condition is provided between an output of said comparator means and a disable input of said driver means, said removing means comprising said disable input of said driver means.

9. The circuit of claim 1, wherein said means for removing comprises a switching device coupled to said control terminal of said power transistor device for coupling said control signals to ground.

10. The circuit of claim 1, wherein said means for removing comprises a disable input to said driver means coupled to switching means provided in said driver means for removing said control signals from said control terminal.

11. The circuit of claim 10, wherein said switching means comprises means for discharging said control terminal.

12. The circuit of claim 11, further comprising a gate resistance between said driver means and said control terminal, and further comprising a diode normally reverse biased in parallel with said gate resistance during normal conduction of said power transistor device, for rapidly discharging said control terminal during an overcurrent condition through said switching means.

13. The circuit of claim 12, further comprising an avalanche diode coupled in series with said gate resistance, said avalanche diode being reversed biased in avalanche mode during normal conduction of said power transistor device and forward biased during an overcurrent condition.

14. The circuit of claim 1, further comprising an avalanche diode coupled between said control terminal and ground for protecting said control terminal from over voltage conditions.

15. The circuit of claim 1, wherein said power transistor device comprises an IGBT.

16. A method for detecting and protecting against an overcurrent condition in a power transistor switching device, the power transistor switching device having main terminals and a control terminal, the main terminals having a range of normal saturation voltage therebetween during normal conduction of the power transistor device, the method comprising:

providing control signals to the control terminal of the power transistor device for switching said power transistor device on and off;

sensing the saturation voltage of the power transistor device including providing substantially said saturation voltage as an output when the saturation voltage is in the range of normal saturation voltage and providing substantially a fixed further reference voltage level as the output when the saturation voltage is beyond said range of normal saturation voltage and further comprising receiving the output and comparing substantially said saturation voltage to a reference voltage level when said saturation voltage is in the range of normal saturation voltage and comparing substantially the fixed further reference voltage level to said reference voltage level when said saturation voltage is beyond said range of normal saturation voltage;

removing said control signals from said control terminal in the event said saturation voltage reaches a level beyond said range of normal saturation voltage indicating an overcurrent condition in said power transistor device; and further comprising providing a time delay for preventing removing of said control signals in the event of a transient overcurrent condition at said power transistor device less than a time period that would damage said power transistor device.

17. The method of claim 16, wherein said step of comparing further comprises:

receiving at an input substantially the saturation voltage when the saturation voltage is in the normal range;

receiving at the input substantially the fixed further reference voltage level when the saturation voltage is beyond the normal range; and generating a removal signal to remove said control signals from said control terminal if said input exceeds said reference voltage level.

18. The method of claim 17, wherein said steps of providing said saturation voltage and the fixed further reference voltage level comprise reverse biasing a diode during an overcurrent condition when the saturation voltage reaches a level beyond said range of normal saturation voltage and causing a voltage at the input to exceed said reference voltage level thereby generating said removal signal.

19. The method of claim 17, further comprising providing a time delay disabling said step of comparing during a start-up condition such that said power transistor device can be initially switched on during said startup condition.

20. The method of claim 19, wherein said step of providing a time delay, comprises disabling said step of providing control signals during a start-up condition.

21. The method of claim 16, further comprising delaying said step of sensing in the event of transient conditions at said power transistor device.

22. The method of claim 16, wherein said step of removing comprises coupling said control signals to ground.

23. The method of claim 22, wherein said step of removing comprises discharging a voltage on said control terminal.

24. The method of claim 23, further comprising discharging said voltage on said control terminal through a diode normally back biased during normal conduction of said power transistor device.

25. The method of claim 24, further comprising discharging said control terminal through an avalanche diode normally reversed biased in avalanche mode during normal conduction of said power transistor device.

26. The method of claim 16, further comprising protecting said control terminal from over voltage conditions using an avalanche device.

27. The method of claim 16, wherein said method protects a power transistor device comprising an IGBT.

28. A circuit for detecting and protecting against an overcurrent condition in a power transistor switching device, the power transistor switching device having main terminals and a control terminal, the main terminals having a range of normal saturation voltage therebetween during normal conduction of the power transistor device, the circuit comprising:

driver means providing control signals to the control terminal of the power transistor device for switching said power transistor device on and off;

sensing means coupled to the power transistor device for sensing the saturation voltage of the power transistor device, said sensing means comprising first means for:

comparing said saturation voltage to a fixed first reference voltage;

providing substantially said saturation voltage to a second means for comparing when the saturation voltage is within the normal range; and disconnecting the saturation voltage and providing substantially said fixed first reference voltage to the second means for comparing in the event of an overcurrent;

said second means for comparing comprising means for:

comparing substantially said saturation voltage to a second reference voltage when the saturation voltage is within the normal range;

comparing substantially said first reference voltage to the second reference voltage when the saturation voltage is beyond said normal range;

means responsive to the sensing means and coupled to the control terminal of the power transistor device for removing said control signals from said control terminal in the event substantially said first reference voltage is compared with said second reference voltage, indicating said saturation voltage has reached a level beyond said range of normal saturation voltage and thus an overcurrent condition in said power transistor device; and further comprising time delay means coupled between an output of said second comparing means and said removing means for preventing removing of said control signals in the event of a transient overcurrent condition at said power transistor device for less than a time period that would damage said power transistor device.

29. A method for detecting and protecting against an overcurrent condition in a power transistor switching device, the power transistor switching device having main terminals and a control terminal, the main terminals having a range of normal saturation voltage therebetween during normal conduction of the power transistor device, the method comprising:

provlding control signals to the control terminal of the power transistor device for switching said power transistor device on and off;

sensing the saturation voltage of the power transistor device by;

comparing said saturation voltage to a fixed first reference voltage;

providing substantially said saturation voltage as a result of said step of comparing if said saturation voltage is within the normal range; and providing substantially said fixed first reference voltage as a result of said step of comparing in the event of an overcurrent, and further comprising a second step of comparing comprising:

comparing substantially said saturation voltage to a second reference voltage when the saturation voltage is within the normal range; and comparing substantially said fixed first reference voltage to the second reference voltage when the saturation voltage is beyond said normal range;

removing said control signals from said control terminal in the event substantially said first reference voltage is compared with said second reference voltage in said second step of comparing, indicating said saturation voltage has reached a level beyond said range of normal saturation voltage and thus an overcurrent condition in said power transistor device; and further comprising providing a time delay for preventing removing of said control signals in the event of a transient overcurrent condition at said power transistor device less than a time period that would damage said power transistor device.

* * * * *